United States Patent
Rombach

(10) Patent No.: US 10,351,416 B2
(45) Date of Patent: Jul. 16, 2019

(54) MODULE COMPRISING A MEMS COMPONENT MOUNTED WITHOUT SUBJECTING SAME TO STRESS

(71) Applicant: TDK Corporation, Tokyo (JP)

(72) Inventor: Pirmin Hermann Otto Rombach, Kongens Lyngby (DK)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 15/541,316

(22) PCT Filed: Nov. 6, 2015

(86) PCT No.: PCT/EP2015/075947
§ 371 (c)(1),
(2) Date: Jun. 30, 2017

(87) PCT Pub. No.: WO2016/116183
PCT Pub. Date: Jul. 28, 2016

(65) Prior Publication Data
US 2018/0016134 A1    Jan. 18, 2018

(30) Foreign Application Priority Data

Jan. 20, 2015 (DE) .......... 10 2015 100 757

(51) Int. Cl.
*H04R 1/02* (2006.01)
*B81B 7/00* (2006.01)
(Continued)

(52) U.S. Cl.
CPC .......... *B81B 7/0048* (2013.01); *H04R 1/021* (2013.01); *B81B 2201/0257* (2013.01);
(Continued)

(58) Field of Classification Search
CPC ............ B81B 7/0048; B81B 2201/003; B81B 2201/02; B81B 2207/07; H04R 1/021
See application file for complete search history.

(56) References Cited

U.S. PATENT DOCUMENTS 8,432,007 B2 * 4/2013 Leidl .................... B81B 7/0064
257/416
8,531,018 B2 9/2013 Pahl
(Continued)

FOREIGN PATENT DOCUMENTS

CN         1510742 A       7/2004
DE   10 2007 010 711 A1   9/2008
(Continued)

OTHER PUBLICATIONS

International Search Report corresponding to PCT Patent Application No. PCT/EP2015/075947, European Patent Office, dated May 2, 2016; (3 pages).

*Primary Examiner* — Brian Ensey
(74) *Attorney, Agent, or Firm* — Nixon Peabody LLP

(57) ABSTRACT

A model is specified in which a MEMS component is connected to the carrier in a stress-free fashion over a large temperature range. For this purpose, a mechanical connection comprises a compensation structure which bridges a horizontal offset of mounting points by means of a horizontal shoulder and the thermal expansion coefficient of which is suitably selected.

20 Claims, 2 Drawing Sheets

(51) Int. Cl.
   *H04R 19/00* (2006.01)
   *H04R 19/04* (2006.01)
(52) U.S. Cl.
   CPC ........ *B81B 2207/07* (2013.01); *H04R 19/005* (2013.01); *H04R 19/04* (2013.01); *H04R 2201/003* (2013.01)

(56) References Cited

U.S. PATENT DOCUMENTS

| | | |
|---|---|---|
| 2003/0038415 A1 | 2/2003 | Anderson et al. |
| 2004/0110322 A1 | 6/2004 | Hougham |
| 2010/0157562 A1 | 6/2010 | Foote |
| 2010/0167799 A1 | 7/2010 | Makihata |
| 2011/0230068 A1* | 9/2011 | Pahl ................ B81B 7/0048 29/825 |

FOREIGN PATENT DOCUMENTS

| | | |
|---|---|---|
| DE | 102007025992 A1 | 12/2008 |
| DE | 10 2010 012042 A1 | 9/2011 |
| EP | 2006248 A2 | 12/2008 |
| JP | 2001-356220 A | 12/2001 |
| JP | 2008-072580 A | 3/2008 |
| JP | 2009-257984 A | 11/2009 |
| WO | WO 2008/032785 A1 | 3/2008 |
| WO | WO 2013/132065 A2 | 9/2013 |
| WO | 2014/094831 A1 | 6/2014 |

* cited by examiner

MODULE COMPRISING A MEMS COMPONENT MOUNTED WITHOUT SUBJECTING SAME TO STRESS

CROSS-REFERENCE TO RELATED APPLICATIONS

This application is a U.S. National Stage of International Application No. PCT/EP2015/075947, filed Nov. 6, 2015, which claims the benefit of Germany Patent Application No. 10 2015 100 757.6, filed on Jan. 20, 2015, both of which are incorporated herein by reference in their entireties.

The invention relates to modules in which a MEMS component is mounted in a stress-free fashion over a wide temperature range.

MEMS (Micro-Electro-Mechanical System) components comprise mechanically active structures which frequently react sensitively to mechanical stresses. A MEMS component can be, for example, an electro-acoustic transducer which is mounted together with an ASIC (ASIC=Application Specific Integrated Circuit) Chip on a carrier of a microphone module and connected. The transducer can have in this context a membrane which is capable of oscillating and a backplate which form two electrodes of a capacitor. Oscillations of the membrane relative to the backplate give rise to capacitance which varies over time. By evaluating the capacitance, e.g. by means of an ASIC, it is possible for a sound signal to be converted into an electrical signal.

It is problematic that the carrier and the material of the transducer generally have different thermal expansion coefficients (CTE: Thermal expansion coefficient). In the case of a change in temperature, the mechanical stresses are passed on to the transducer by the connections between the carrier and the transducer. Mechanical stresses in the transducer prevent unimpeded operation of the mechanical structures so that changes in temperature have an adverse effect on the signal quality of the microphone.

Temperature-induced disruptions occur not only with microphones. In principle, all MEMS components, e.g. also pressure sensors or filter components which operate with acoustic waves are affected.

The persistent trend towards ever more wide ranging miniaturization which requires e.g. thinner MEMS components accentuates these problems because thinner components deform to a greater extent under the effect of external forces.

The initiation of mechanical stresses in the MEMS component could be reduced by soft, easily deformable spring elements as connecting elements between the carrier and MEMS component. However, the mechanical stability of the connection would also be reduced and corresponding modules could no longer pass load tests, e.g. drop tests.

There is therefore a desire for modules which satisfy contradictory requirements, mechanical stability together with at the same time stress-free mounting of the MEMS component and in addition permit wide ranging miniaturization without having to make compromises in terms of signal quality.

For this purpose, in the text which follows a module and various advantageous properties are specified which, individually or in combination, can improve the module according to the independent claim 1 which is described below. Dependent claims specify advantageous refinements of the module.

The module comprises a carrier having a first thermal expansion coefficient $K_1$, a first mounting point and a second mounting point. The module also comprises a MEMS component with MEMS structures, a second thermal expansion coefficient $K_2$ which is different from the first thermal expansion coefficient $K_1$, a first mounting point and a second mounting point. In addition, the module comprises a first mechanical connection between the first mounting point of the carrier and the first mounting point of the component. Furthermore, the module has a second mechanical connection between the second mounting point of the carrier and the second mounting point of the component. The second mechanical connection has a compensation structure with a thermal expansion coefficient $K_K$. The two mounting points on the MEMS component are spaced apart by horizontal distance $d_1$, and the mounting points on the carrier are spaced apart by a horizontal distance $d_2$. The values for $d_1$ and $d_2$ are selected such that in the case of a change in the temperature the compensation structure compensates the different changes in length of $d_1$ and $d_2$, with the result that in the case of different temperatures the MEMS component is connected in a stress-free but secure fashion to the carrier.

It has been found that mechanical connections between the carrier and the component can be dimensioned in such a way, and their material, in particular their coefficients of expansion, can be selected in such a way that changes in length induced different temperature can be compensated precisely. The mechanical connections can be embodied here in a very solid fashion and therefore be extremely stable, since they do not have to absorb any mechanical deformation energy in order to act as an expansion buffer between the carrier and the component. Such a module can therefore have a mechanically extremely stable connection between the carrier and the component without the method of functioning of the component being adversely affected by mechanical stress. For this reason, it is also possible to configure the component to be so thin that the requirements in respect of compactness are satisfied.

The compensation structure could in fact be dispensed with if there is only a single mechanical connection between the carrier and the component, because both bodies could then experience their different expansions in length without disruption. However, the mechanical connections generally also constitute at the same time electrical signal paths, with the result that generally a relatively large number of connections, e.g. two, three or four exist.

In the simplest case there are two mechanical connections between the carrier and the component. In such an embodiment the compensation structure bridges the distance $\Delta d = d_2 - d_1$ along the connecting direction between the two mounting points. In addition, the following applies:

$$d_2 = d_1 \frac{K_x - K_1}{K_x - K_2} \tag{1}$$

That is to say the distances d and the coefficients K of expansion are selected correspondingly. There are multiple ways of doing this: the distances between the mounting points can be selected at given coefficients of expansion (which are generally given due to the selection of the materials). In particular, it is sufficient to select one of the two distances if the respective other distance and the coefficients are given. Another possibility for given distances is to select the material of the compensation structure, the material of the carrier or the material of the component in accordance with the equation.

The meaning of the variables and the method of functioning of the compensation structure are illustrated clearly here in FIGS. 1 and 2.

It is possible that the coefficient of expansion $K_k$ of the compensation structure is larger than the larger of the two values $K_1$ and $K_2$:

$$K_K > \max(K_1, K_2) \quad (2)$$

Alternatively it is possible that the coefficient of expansion $K_K$ is smaller than the smaller of the two values $K_1$ and $K_2$. Correspondingly the following applies:

$$K_K < \min(K_1, K_2) \quad (3)$$

It is also possible that the compensation structure comprises a horizontal section which is arranged on or above the carrier.

In particular, the horizontal section serves, in the case of a change of length in the carrier and the component, to avoid stresses by means of a single change of length which is correspondingly adapted. The horizontal section bridges here a horizontal region and runs essentially parallel to the surface of the carrier. However, it is also possible for the horizontal section also to bridge, in a more or less flat angle, the difference in height between the upper side of the carrier and the underside of the component.

In principle, a single electrical connection, which can also at the same time be a mechanical connection, is sufficient to pass on a signal from the MEMS component to the carrier. The component could therefore have a single floating electrode.

However, it is generally preferred to apply a voltage or a current to at least one circuit element in the component, with the result that a minimum number of two electrical connections is preferred. If a further mechanical connection is added and the component is supported at three points, the mechanical stability of the suspension is improved clearly once more. The number of the mechanical and electrical connections between the carrier and the component can be even significantly larger here. If the component is e.g. an electro-acoustic transducer and comprises a plurality of diaphragms or a plurality of backplates to each of which an electrical potential is to be applied, four, five or six electrical connections can also be provided here between the carrier and the component.

It is therefore possible for the module also to comprise one or more additional compensation structures which connect additional mounting points of the carrier to additional mounting points of the component.

At least one of the mechanical connections, but preferably a plurality or all of the mechanical connections, comprise here a compensation structure which, together with the other compensation structures, compensates, the different changes in length of the carrier and MEMS component in the case of a change in temperature. The individual mechanical connections and/or their compensation structures can be of the same design here and can be selected from the same materials. If the module has more than two compensation structures, it is no longer possible to orient the compensation structures along a connecting line between two mounting points. Instead, such a module has a common center, when viewed from which the compensation structures are arranged in a radial direction. When there are more than two compensation structures, the dimensionality of the geometry of the arrangements of the compensation structures increases. When there are merely two mounting points per body, the different length expansion is a unidimensional problem. When there are three or more compensation structures, different coefficients of expansion are present in two dimensions, wherein each coefficient of expansion $K_1$, $K_2$, $K_K$ can have different components in the x and y directions, respectively.

If the coefficients of expansion are isotropic, all the compensation structures are of the same design and are arranged in a rotationally symmetrical fashion about a common center, the different thermal expansion can be attributed again to a unidimensional problem for which equation (1) applies. In this context, the variables $d_1$ and $d_2$ represent the distances between the respective mounting point of the compensation structure and the common center.

It is possible that the carrier comprises a ceramic material or an organic material, e.g. a circuit board material and/or BCB (benzocyclobutene).

It is also possible that the MEMS component comprises a body made of a semiconductor material, i.e. Si (silicon).

The carrier here can have a plurality of dielectric layers between which structured metallization layers are arranged.

It is possible for at least one compensation structure or all the compensation structures to comprise a metal. The metal can be, for example, Cu (copper), Ag (silver), Au (gold), Ni (nickel) or some other metal which can be applied to the upper side of the carrier with customary metal deposition processes.

It is advantageous if all the compensation structures are arranged radially symmetrically about a common center. The compensation structures do not need to all be at the same distance from the center here. It is also possible for a first group of compensation structures to be at a first distance, and a second group of compensation structures to be at a second distance from the center etc. The compensation structures are then each arranged along virtual circular lines around the center. A rotation of the compensation structures through a certain angle around the center then transforms the compensation structures back into one another again.

It is possible that at least one of the compensation structures or a plurality or all of the compensation structures are connected to a plurality of mounting points on the carrier and/or to a plurality of mounting points on the MEMS component. Such a multi-point connection increases the fail safety of the compensation structure in the event of said structure becoming detached from the carrier or component at a mounting point.

It is possible that the MEMS component has a body with a height ≤700 μm and with a side length between 0.3 mm and 5 mm.

Correspondingly thin MEMS components can be mounted as it were in a stress-free fashion over a wide temperature range owing to the compensation structure described above, and said MEMS component contributes significantly less to the overall height of the module compared to conventional mounting means.

It is possible that the MEMS component is an electro-acoustic transducer. The electro-acoustic transducer can comprise here at least one diaphragm and at least one backplate, a body made of silicon with a structured cavity behind the diaphragm and at least two electrical connections.

The module constitutes here a microphone, wherein the microphone can also comprise a further chip in which e.g. an ASIC is integrated.

Such a microphone can have three or more compensation structures in the module here, which are arranged in a rotationally symmetrical fashion about a center. The electro-acoustic transducer also has a signal input which is arranged in the region of the center.

The material of the compensation structures can comprises here essentially any material, preferably any conductive material, whose thermal expansion coefficient is smaller than the smaller of the two bodies. The following then applies: $d_2<d_1$. Alternatively, the thermal expansion coefficient of the compensation structure can also be larger than the larger of the thermal expansion coefficients of the bodies. The following then applies: $d_2>d_1$.

Methods for developing corresponding modules can use here the optimization software TopOpt which has been developed at the Technical University of Denmark (DTU). In particular if external compulsory conditions necessitate departing from a purely unidimensional design, e.g. because a sound inlet opening must not be covered by the compensation structures, because the mechanical stability has to be optimized for particularly strict drop tests etc., software-supported simulation tools are advantageous.

It is possible that the compensation structure is provided for mounting the MEMS component elastically, i.e. in the sprung fashion. Then, e.g. acceleration peaks and/or forces can be incorporated into a telephone on installation and mechanically induced deformations can be attenuated or avoided.

The module and the principles of action of the compensation structures are explained in more detail on the basis of the schematic figures and on the basis of non-restrictive exemplary embodiments.

In the drawings:

FIG. 1 shows the spatial arrangement of a carrier, a component and of two mechanical connections at a first temperature, FIG. 2 shows the same arrangement at a second temperature, FIG. 3 shows an exemplary conventional microphone, FIG. 4 shows a section of a microphone in which an electro-acoustic transducer is connected and wired to a multi-layer substrate via a compensation structure, FIG. 5 shows a perspective view of a module with a component that is connected to a carrier by mechanical connections.

Figure 1:
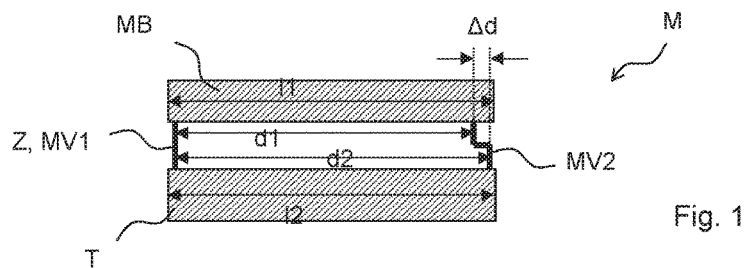

FIG. 1 shows an arrangement of a module M with a MEMS component MB on a carrier T. The component MB and the carrier T are connected via a first mechanical connection MV1 and via a second mechanical connection MV2. The distance between the connecting points on the component is $d_1$. The distance between the connecting points on the carrier T is $d_2$. At a specific temperature, the component has a length $l_1$ and the carrier has a length $l_2$.

If the dimensions and the materials are correspondingly selected, a complete compensation of the longitudinal extent and therefore complete avoidance of thermally induced stresses is brought about in the entire temperature range in which the materials expand linearly with a change in temperature.

Figure 2:
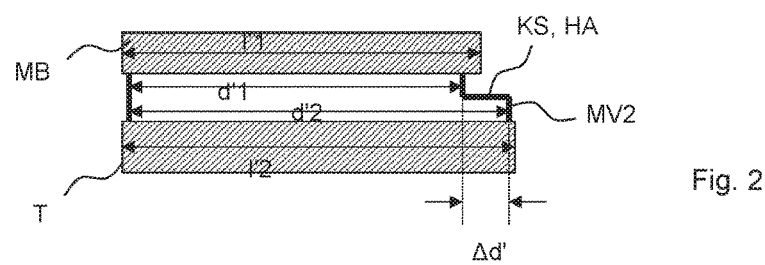

FIG. 2 shows the same design at a temperature which deviates by a temperature difference $\Delta T$ from the temperature of the situation shown in FIG. 1. The length of the component MB has increased here from $l_1$ to $l'_1$. The distance between the mounting points on the component has increased from $d_1$ to $d_1'$:

$$d'_1=d_1+d_1K_1\Delta T=d_1(1+K_1\Delta T) \quad (4)$$

The distance between the mounting points on the carrier has increased from $d_2$ to $d_2'$:

$$d'_2=d_2+d_2K_2\Delta T=d_2(1+K_2\Delta T) \quad (5)$$

If the distance between the mounting points at the temperature in FIG. 1 is still $\Delta d$:

$$\Delta d=d_2-d_1 \quad (6),$$

the distance therefore increases to $\Delta d'$:

$$\Delta d'=d'_2-d'_1 \quad (7)$$

The second mechanical connection MV2 has here a compensation structure KS with a horizontal section HA which covers the length difference $\Delta d$ and $\Delta d'$, respectively. Relative to the distances d, the material of the compensation structure KS and its horizontal section HA is selected such that the different length expansion $\Delta d'-\Delta d$ is compensated. In the case of linear expansion the following applies:

$$\Delta d'=\Delta d(1+K_x\Delta T) \quad (8)$$

From (4) and (5) it follows:

$$\Delta d'=\Delta d+(d_2K_2-d_1K_1)\Delta T \quad (9)$$

From (8) and (9) it follows:

$$\Delta d(1+K_K\Delta T)=\Delta d+(d_2K_2-d_1K_1)\Delta T \quad (10)$$

It follows from this:

$$\Delta d K_K=d_2K_2-d_1K_1 \quad (11)$$

The equation (11) is obtained directly from equation (1).

If the carrier T has a larger thermal expansion coefficient than the MEMS component MB, $d_2>d_1$. In the opposite case ($K_1>K_2$), $d_1>d_2$ must be true or the thermal expansion coefficient of the compensation structure KS must be smaller than the thermal expansion coefficient of the carrier T. Instead of a compensation structure with a small thermal expansion coefficient, the design can be reversed.

Figure 3:
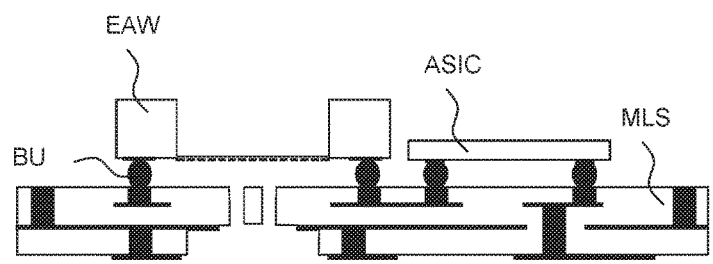

FIG. 3 shows a section of a conventional microphone image in which an electro-acoustic transducer EAW is connected and wired to a multi-layer substrate MLS via bump connections BU. In addition to the electro-acoustic transducer EAW, a chip with an ASIC is arranged on the multi-layer substrate MLS. Different coefficients of expansion of the multi-layer substrate, transducer EAW and chip ASIC disrupt the functionality of the transducer EAW significantly more than the generally exclusively electrical functionality of the chip ASIC. This is because the transducer reacts more sensitively to mechanical stresses than the chip ASIC.

Figure 4:
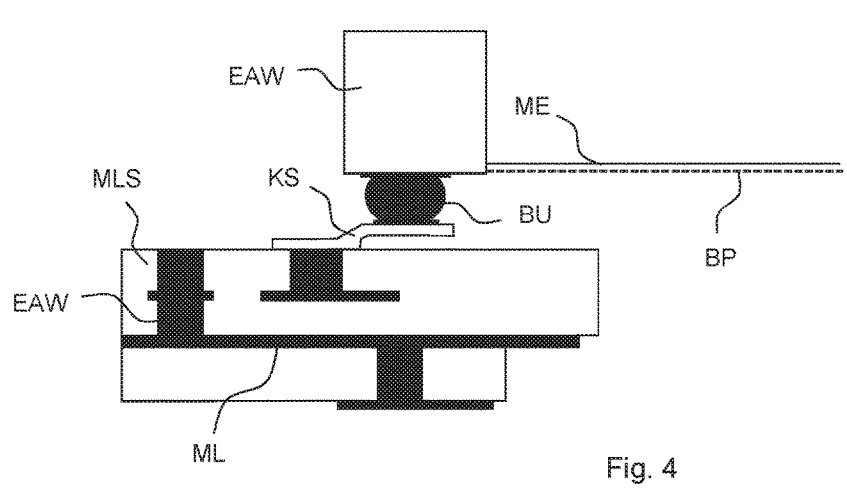

FIG. 4 shows a corresponding improvement of the microphone in which the electro-acoustic transducer, here with a diaphragm ME and a back plate BP, is not connected and wired directly to the multi-layer substrate MLS via a bump connection but instead to a compensation structure KS. At the location which is provided for connection to the solder material, a solder pad can be arranged. Analogously, the transducer EAW can also have solder pads so that a continuous solder connection can be formed.

Figure 5:
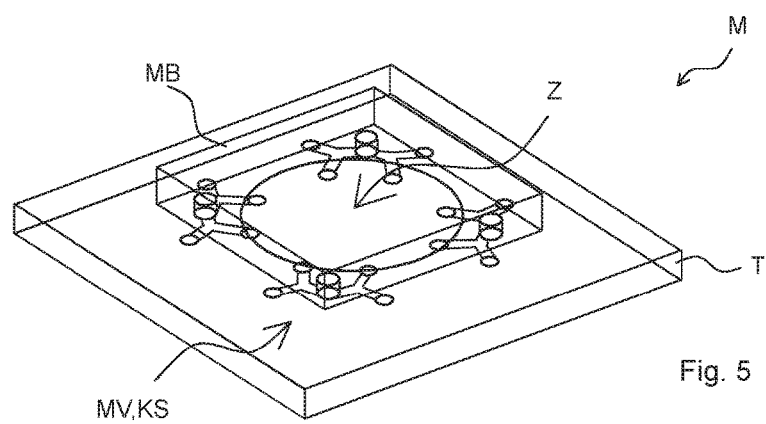

FIG. 5 shows a perspective view of a module M in which an MEMS component MB is arranged on a carrier T and connected and wired via mechanical connections or their compensation structures KS. The module comprises here four mechanical connections which are arranged and oriented in a rotationally symmetrical fashion about their common center Z. Each of the mechanical connections has four contact points to the carrier T and one contact point to the component MB.

In the region of the center Z, the component MB has a sound inlet opening. In this context, the mechanical connections MV are grouped around the sound inlet opening in such a way that an acoustic signal can be received without difficulty.

Figure 6:
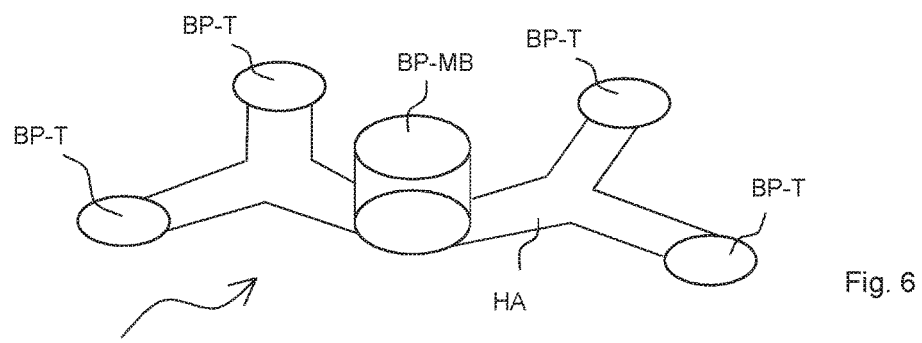
FIG. 6 shows a perspective view of a compensation structure in FIG. 5.

FIG. 6 shows a mechanical connection in FIG. 5 in a perspective view. The mechanical connection has four mounting points BP-T with which it is mounted on the carrier. In addition, the mechanical connection has a mounting point BP-MB via which is it connected to the MEMS component. The mechanical connection also comprises horizontal sections HA which permit compensation of the length in two dimensions.

The horizontal sections HA can be raised slightly with respect to the mounting points on the carrier BP-T so that no mechanical stresses can be formed between the horizontal sections HA and the carrier T.

Such mechanical connections can be fabricated during the manufacturing process in that the horizontal sections HA are applied to a sacrificial material on the carrier T which is removed after the application of the material of the horizontal sections HA.

Figures 7, 8:
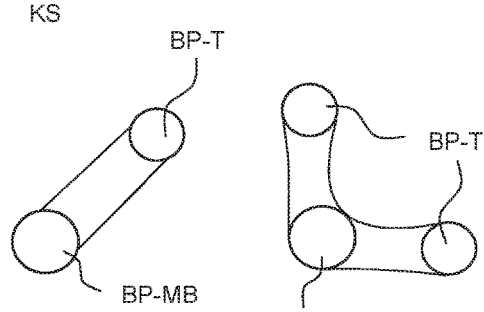
FIG. 7 shows a mechanical connection with an essentially unidimensional orientation.
FIG. 8 shows a mechanical connection with a two-dimensional orientation.

FIG. 7 shows an essentially unidimensionally configured mechanical connection which has precisely one mounting point on the carrier BP-T and precisely one mounting point for the MEMS component BP-MB. A horizontal section between them connects the two points.

FIG. 8 shows an embodiment of a mechanical connection which has horizontal sections in two directions. Correspondingly, there are two mounting points BP-T for the carrier and one mounting point BP-MB for the component.

Figure 9:
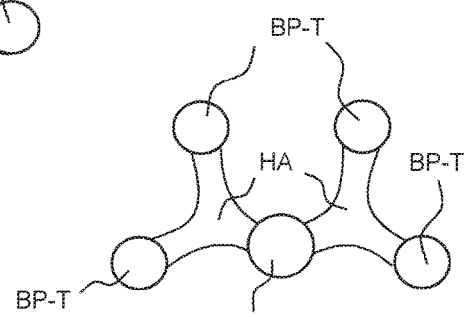
FIG. 9 shows a development of the mechanical connection in FIG. 6 with stress-reduced horizontal sections.

The horizontal sections are configured here—in contrast to the configuration in FIG. 7—not by means of sections with linearly extending edges but rather by means of sections with edges which run in a curve, in order to avoid concentrations of mechanical stress. Correspondingly, FIG. 9 shows an embodiment of a mechanical connection with four mounting points BP-T for the carrier and one mounting point BP-MB for the component, wherein the horizontal sections HA are also configured by sections with edges which extend in a curved fashion.

The module is not limited to the exemplary embodiment shown. Modules with further mechanical and/or electrical connections for a temperature compensation or modules with further components likewise constitute implementations according to the invention.

LIST OF REFERENCE SYMBOLS

ASIC: ASIC chip
BP: Back plate
BP-MB: Mounting point for the component
BP-T: Mounting point for the carrier
BU: Bump connection
$d_1$: Distance between the mounting points on the MEMS component or distance between the mounting points on the MEMS component from the center
$d_2$: Distance between the mechanical connections on the carrier or distance between the mounting point of the mechanical connection from the center on the carrier
EAW: Electro-acoustic transducer
HA: Horizontal section
$K_1$: Thermal expansion coefficient of carrier
$K_2$: Thermal expansion coefficient of component
$K_K$: Thermal expansion coefficient of compensation structure
KS: (Thermal) compensation structure
$l_1$: Length of MEMS component
$l_2$: Length of carrier
M: Module
MB: MEMS component
ME: Diaphragm
MLS: Multi-layer substrate
MV: Mechanical connection
MV, MV2: First, second mechanical connections
T: Carrier
Z: Center (of symmetry)
$\Delta d, \Delta d'$: Horizontal distance to be spanned by the compensation structure

The invention claimed is:

1. An electric module, comprising
a carrier having a first thermal expansion coefficient $K_1$, a first mounting point and a second mounting point,
a MEMS component with MEMS structures, a second thermal expansion coefficient $K_2 \neq K_1$, a first mounting point and a second mounting point,
a first mechanical connection between the first mounting point of the carrier and the first mounting point of the component,
a second mechanical connection between the second mounting point of the carrier and the second mounting point of the component with a compensation structure with a thermal expansion coefficient $K_K$,
wherein
the mounting points on the MEMS component are spaced apart by a horizontal distance $d_1$ and the mounting points on the carrier are spaced apart by a horizontal distance $d_2$,
the values for $d_1$ and $d_2$ are selected such that in the case of a change in the temperature the compensation structure compensates the different changes in length of $d_1$ and $d_2$, and in the case of different temperatures the MEMS component is connected in a stress-free fashion to the carrier, and
wherein
the compensation structure bridges the distance $\Delta d = d_2 - d_1$ along the connecting direction between the two second mounting points, and
the equation $d_2 = d_1(K_K - K_1)/(K_K - K_2)$ is satisfied.

2. The module according to claim 1, wherein $K_K$ is either larger than the larger of the two values $K_1$ and $K_2$: $K_K > \max(K_1, K_2)$ or
smaller than the smaller of the two values $K_1$ and $K_2$: $K_K < \min(K_1, K_2)$.

3. The module according to claim 1, wherein the compensation structure comprises a horizontal section which is arranged on or above the carrier.

4. The module according to claim 1, additionally comprising one or more additional compensation structures which connect additional mounting points of the carrier to additional mounting points of the MEMS component.

5. The module according to claim 1, wherein the first mechanical connection comprises a compensation structure which, together with the other compensation structures, compensates the different changes in length of the carrier and MEMS component in the case of a change in temperature.

6. The module according to claim 1, in which at least one compensation structure forms an electrical connection between the carrier and MEMS component.

7. The module according to claim 1, wherein the carrier comprises a ceramic material or an organic circuit board material.

8. The module according to claim 7, wherein the carrier has a plurality of dielectric layers between which structured metallization layers are arranged.

9. The module according to claim 1, wherein the MEMS component comprises a body made of a semiconductor material.

10. The module according to claim 1, wherein at least one compensation structure comprises a metal.

11. The module according to claim 1, wherein all the compensation structures are arranged radially symmetrically about a center.

12. The module according to claim 1, wherein at least one compensation structure is connected to a plurality of mounting points on the carrier and/or to a plurality of mounting points on the MEMS component.

13. The module according to claim 1, wherein the MEMS component has a body with a height $\leq 700$ μm and with a side length between 0.3 mm and 5 mm.

14. A microphone comprising a module according to claim 1, wherein the MEMS component is an electro-acoustic transducer.

15. The microphone according to claim 14 wherein
the module has three or more compensation structures which are arranged in a rotationally symmetrical fashion about a center, and
the electro-acoustic transducer comprises a sound input in the center.

16. The microphone according to claim 14, wherein the compensation structure is provided for mounting the MEMS component elastically.

17. An electric module, comprising
a carrier having a first thermal expansion coefficient $K_1$, a first mounting point and a second mounting point,
a MEMS component with MEMS structures, a second thermal expansion coefficient $K_2 \neq K_1$, a first mounting point and a second mounting point,
a first mechanical connection between the first mounting point of the carrier and the first mounting point of the component,
a second mechanical connection between the second mounting point of the carrier and the second mounting point of the component with a compensation structure with a thermal expansion coefficient $K_k$,
wherein
the mounting points on the MEMS component are spaced apart by a horizontal distance $d_1$ and the mounting points on the carrier are spaced apart by a horizontal distance $d_2$,
the values for $d_1$ and $d_2$ are selected such that in the case of a change in the temperature the compensation structure compensates the different changes in length of $d_1$ and $d_2$, and in the case of different temperatures the MEMS component is connected in a stress-free fashion to the carrier, and
wherein $K_K$
is either larger than the larger of the two values $K_1$ and $K_2$: $K_K$>max ($K_1$, $K_2$) or
smaller than the smaller of the two values $K_1$ and $K_2$: $K_K$<min ($K_1$, $K_2$).

18. The module according to claim 17, wherein the MEMS component is an electro-acoustic transducer.

19. The module according to claim 18 wherein
the module has three or more compensation structures which are arranged in a rotationally symmetrical fashion about a center, and
the electro-acoustic transducer comprises a sound input in the center.

20. The module according to claim 18, wherein the compensation structure is provided for mounting the MEMS component elastically.

* * * * *